(12) United States Patent
Leong et al.

(10) Patent No.: US 8,504,973 B1
(45) Date of Patent: Aug. 6, 2013

(54) SYSTEMS AND METHODS FOR GENERATING A TEST ENVIRONMENT AND TEST SYSTEM SURROUNDING A DESIGN OF AN INTEGRATED CIRCUIT

(75) Inventors: Wai Kheong Leong, Ipoh (MY); Kent Orthner, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 199 days.

(21) Appl. No.: 13/088,300

(22) Filed: Apr. 15, 2011

Related U.S. Application Data

(60) Provisional application No. 61/324,713, filed on Apr. 15, 2010.

(51) Int. Cl.
*G06F 17/50* (2006.01)

(52) U.S. Cl.
USPC ........... 716/136; 716/102; 716/103; 716/104; 716/106

(58) Field of Classification Search
USPC .......................................... 716/102–108, 136
See application file for complete search history.

(56) References Cited

U.S. PATENT DOCUMENTS

| | | | | |
|---|---|---|---|---|
| 4,224,664 A | * | 9/1980 | Trinchieri | 714/25 |
| 6,581,194 B1 | | 6/2003 | Carpenter et al. | |
| 6,754,763 B2 | | 6/2004 | Lin | |
| 6,810,442 B1 | | 10/2004 | Lin et al. | |
| 7,155,435 B1 | * | 12/2006 | Day et al. | 715/751 |
| 7,257,524 B2 | | 8/2007 | Schilp et al. | |
| 7,328,195 B2 | | 2/2008 | Willis | |
| 7,616,568 B2 | | 11/2009 | Olderdissen et al. | |
| 2003/0144828 A1 | | 7/2003 | Lin | |
| 2003/0225565 A1 | * | 12/2003 | Garcia et al. | 703/23 |
| 2004/0107405 A1 | * | 6/2004 | Schein | 715/530 |
| 2005/0004777 A1 | * | 1/2005 | Houlihane | 702/119 |
| 2005/0165597 A1 | * | 7/2005 | Nightingale | 703/27 |
| 2006/0117274 A1 | | 6/2006 | Tseng et al. | |
| 2006/0272021 A1 | * | 11/2006 | Marinescu et al. | 726/24 |
| 2008/0107104 A1 | | 5/2008 | Olderdissen et al. | |
| 2008/0313587 A1 | | 12/2008 | Nightengale et al. | |
| 2009/0300419 A1 | | 12/2009 | Silverman et al. | |
| 2010/0040085 A1 | | 2/2010 | Olderdissen et al. | |
| 2010/0082315 A1 | * | 4/2010 | Hall | 703/13 |
| 2010/0095255 A1 | * | 4/2010 | Thompson et al. | 716/5 |
| 2011/0173299 A1 | * | 7/2011 | Lightstone et al. | 709/219 |

OTHER PUBLICATIONS

"Avalon Interface Specifications" (Aug. 2010), Altera Corporation, San Jose, CA., Version 1.3, 67 pages.

* cited by examiner

*Primary Examiner* — Paul Dinh
(74) *Attorney, Agent, or Firm* — Weaver Austin Villeneuve & Sampson LLP

(57) ABSTRACT

Systems and methods for generating and using a test environment and a test system surrounding a design are described. The systems and methods may involve using a same application software for creating a design and for receiving a selection to generate the test environment and the test system. In response to receiving the selection, the systems and methods may execute a verification tool to create the test environment and test system. Moreover, a user may not fill in templates of components of the verification tool. The verification tool is integrated within the application software.

14 Claims, 13 Drawing Sheets

SYSTEMS AND METHODS FOR GENERATING A TEST ENVIRONMENT AND TEST SYSTEM SURROUNDING A DESIGN OF AN INTEGRATED CIRCUIT

CROSS-REFERENCE TO RELATED APPLICATIONS

This application claims the benefit of and claims priority under 35 U.S.C. §119(e) to U.S. Provisional Application No. 61/324,713, filed on Apr. 15, 2010, titled "IP VERIFICATION TOOL", which is incorporated by reference herein in its entirety for all purposes.

FIELD OF THE INVENTION

The present embodiments generally relate to systems and methods for generating a test environment and test system surrounding a design of an integrated circuit.

BACKGROUND

Modern electronic systems are frequently implemented as a combined hardware/software system built on a single silicon chip. The full system design is usually created by using a first tool.

In order to ensure that these chips will function properly, it may be useful to test the full-system design of the electronic system, before incurring the expenses of actually creating the physical silicon chips. The full-system design is typically simulated and tested by using a second tool, such as a simulator.

However, the use of two different tools may increase time and cost associated with testing the full-system design. For example, a user may need to exit the first tool to use the second tool. In addition, the user must provide a written description of components that is created using the first tool to the second tool. As such, two different tools are generally required, thereby increasing cost as well as the time required to create the written description of the components and to simulate them using a second tool.

SUMMARY OF THE INVENTION

Systems and methods for generating and using a test environment for a design are described. In various aspects, the methods include generating a design of a system on a programmable chip, receiving a selection to generate the test environment and test system, and creating the test environment and test system in response to receiving the selection.

In various embodiments, a same application software may be used to generate the design, and to receive the selection to create the test environment and test system, thereby reducing cost and saving time. Thus, a need to purchase two different tools to create the design and to generate the test environment and test system is eliminated. Using the same application software saves time because the need to modify a written description using a first tool, to exit a first tool, and to provide the written description to a second tool to generate the test environment and test system is eliminated. According to one embodiment, the application software may retrieve the written description instead of requiring a user to provide the written description. The application software may retrieve the design description from one or more design descriptions, and may execute a verification tool to generate the test environment and test system, all in response to a user initiating the generation of test environment and test system. The application software includes the verification tool for testing the generated design. The application software may also provide other features, such as dependency, merging callbacks, and transaction extension, to name a few.

BRIEF DESCRIPTION OF THE DRAWINGS

The systems and methods for generating and using a test environment and test system associated with a design of an integrated circuit may best be understood by reference to the following description taken in conjunction with the accompanying drawings, which illustrate various embodiments of the present systems and methods.

DETAILED DESCRIPTION

In some embodiments, methods for generating a test environment and a test system may be integrated within a design creation application software. The design creation application software may be used to create a design of an integrated circuit. The integrated circuit may be an Application Specific Integrated Circuit (ASIC), a custom ASIC, or a programmable logic device (PLD).

In several embodiments, the systems and methods described herein may be used to create the test environment and the test system in response to receiving an input via an input device, e.g., mouse click, etc., after creation of the design.

Methods of various embodiments of the present invention may be implemented using a system level programming language, such as SystemC, SystemVerilog, and advanced verification methods, such as Universal Verification Methodology (UVM), Open Verification Methodology (OVM), or Verification Methodology Manual (VMM). It is appreciated that the methods of generating the test systems for various embodiments of the present invention may be executed by a processing unit, as described below.

Figure 1:
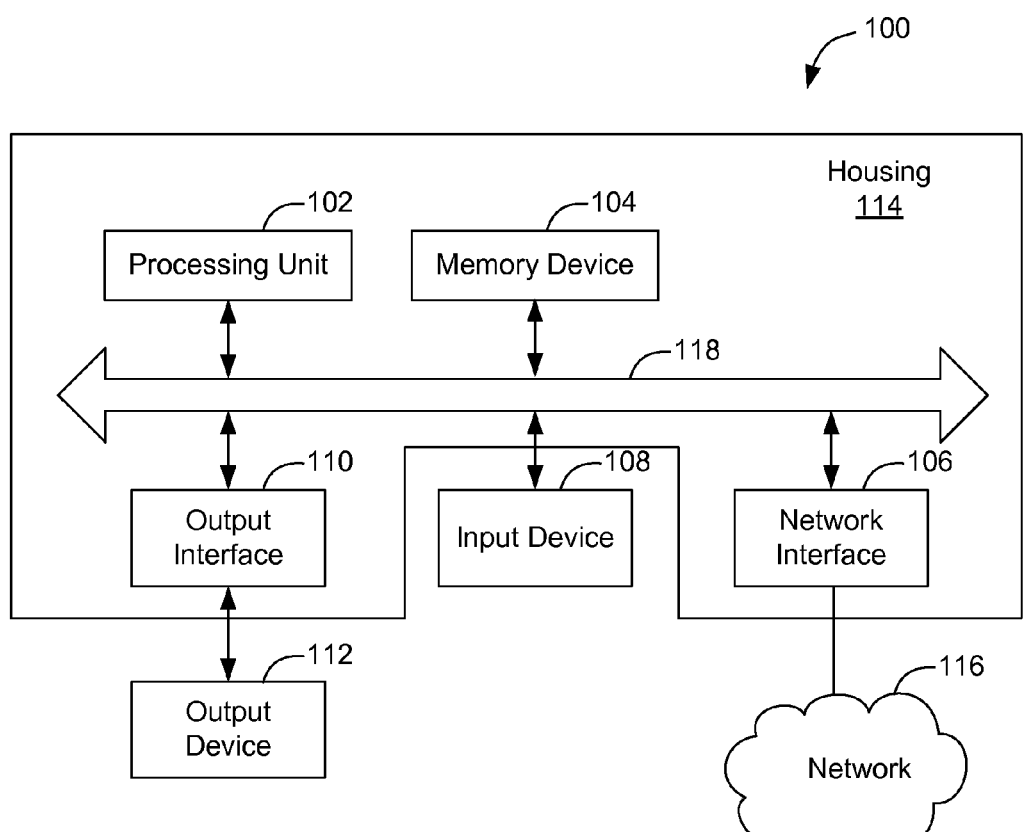
FIG. 1 is an exemplary system for generating and using a test environment and test system, in accordance with one embodiment of the present invention.

Referring to FIG. 1, a system 100 may include a processing unit 102, a memory device 104, a network interface 106, an input device 108, an output interface 110, and an output device 112. Network interface 106, output interface 110, memory device 104, and processing unit 102 may be located within a housing 114 of system 100.

Processing unit 102 may be a central processing unit (CPU), a microprocessor, a floating point coprocessor, a graphics coprocessor, a hardware controller, a microcontroller, a programmable logic device programmed for use as a controller, a network controller, or other processing unit. Memory device 104 may be a random access memory (RAM), a read-only memory (ROM), or a combination of RAM and ROM. For example, memory device 104 may include a non-transitory computer-readable medium, such as a floppy disk, a ZIP™ disk, a magnetic disk, a hard disk, a compact disc-ROM (CD-ROM), a recordable CD, a digital video disc (DVD), or a flash memory. Memory device 104 may store a program code for in accordance with embodiments of the present invention for execution by the processing unit 102. For example, memory device 104 may store the program code for creating a design of an integrated circuit, generating and using a test environment and test system, controlling a flow of information, converting a first protocol into a second protocol, etc., to name a few.

Network interface 106 may be a modem or a network interface card (NIC) that allows processing unit 102 to communicate with a network 116, such as a wide area network (WAN) or a local area network (LAN). Processing unit 102 may be coupled via a wireless connection or a wired connection to network 116. Examples of the wireless connection include a connection using Wi-Fi protocol or a WiMax protocol. The Wi-Fi protocol may be an IEEE 802.11, IEEE 802.11a, IEEE 802.11b, IEEE 802.11g, or IEEE 802.11i protocol. Examples of input device 108 include a mouse, a display device, a keyboard, a stylus, a microphone, a keypad, etc. Output device 112 may be a liquid crystal display (LCD) device, a plasma display device, a light emitting diode (LED) display device, or a cathode ray tube (CRT) display device. Examples of output interface 110 include a video controller that drives output device 112 to display one or more images based on instructions received from processing unit 102. In various embodiments, input device 108 and output device 112 may be integrated within the same device, such as a display device having a touch screen. Processing unit 102 accesses the program code stored on memory device 104 or stored on a remote memory device (not shown), similar to memory device 104, via network 116. The processor unit 102 executes the program code stored therein in order to implement the methods in accordance with various embodiments of the present invention. Processing unit 102, memory device 104, network interface 106, input device 108, output interface 110, and output device 112 communicate with each other via a bus 118.

In various embodiments, system 100 may not include input device 108 and/or network interface 106. In some embodiments, network interface 106, output interface 110, memory device 104, and processing unit 102 may be located outside the housing 114 structure.

In some embodiments, multiple memory devices may be used instead of memory device 104. Moreover, in one embodiment, multiple processing units may be used instead of processing unit 102.

Figure 2:
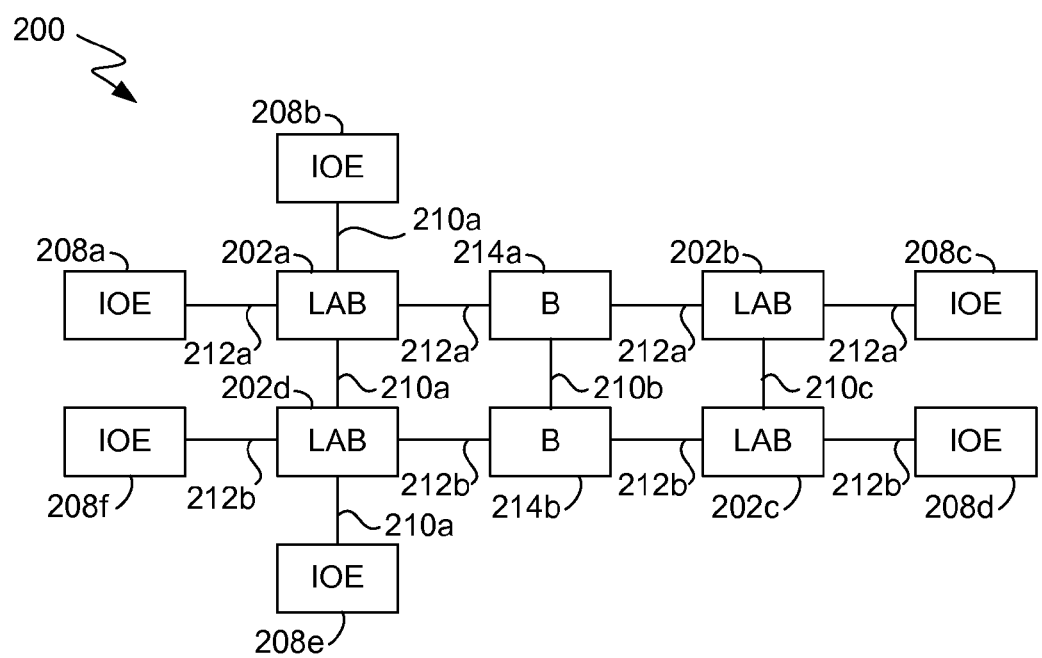
FIG. 2 is an exemplary programmable logic device (PLD), in accordance with one embodiment of the present invention.

With reference to FIG. 2, a PLD 200 may be configured using system 100 of FIG. 1. In some embodiments, PLD 200 may include a two-dimensional array of programmable logic array blocks (LABs) 202 that are interconnected by a network of multiple column interconnects 210 and multiple row interconnects 212 of varying length and speed. Any of the LABs 202, e.g., LAB 202c, can perform one or more functions, such as, digital signal processing (DSP), addition, multiplication, subtraction, etc. The network of column interconnects 210 and row interconnects 212 may include multiple switching circuits (not shown) that can be configured. LABs 202 may include multiple logic elements (LEs) (not shown) and each LE may include one or more registers (not shown). The LEs of one LAB 202a may be coupled to LEs of another LAB 202b via one or more of the switching circuits. A set of input/output (I/O) elements 208 may be located around the periphery of PLD 200 to support numerous single-ended and differential I/O standards. PLD 200 may further include a set of buffers (Bs) 214 that couple to LABs 202. The buffers 214 may be used to store data that is transferred between LABs 202. PLD 200 may function synchronous or asynchronous with one or more clock signals received via a clock tree (not shown). The clock tree may be overlaid on the PLD 200.

Figure 3:
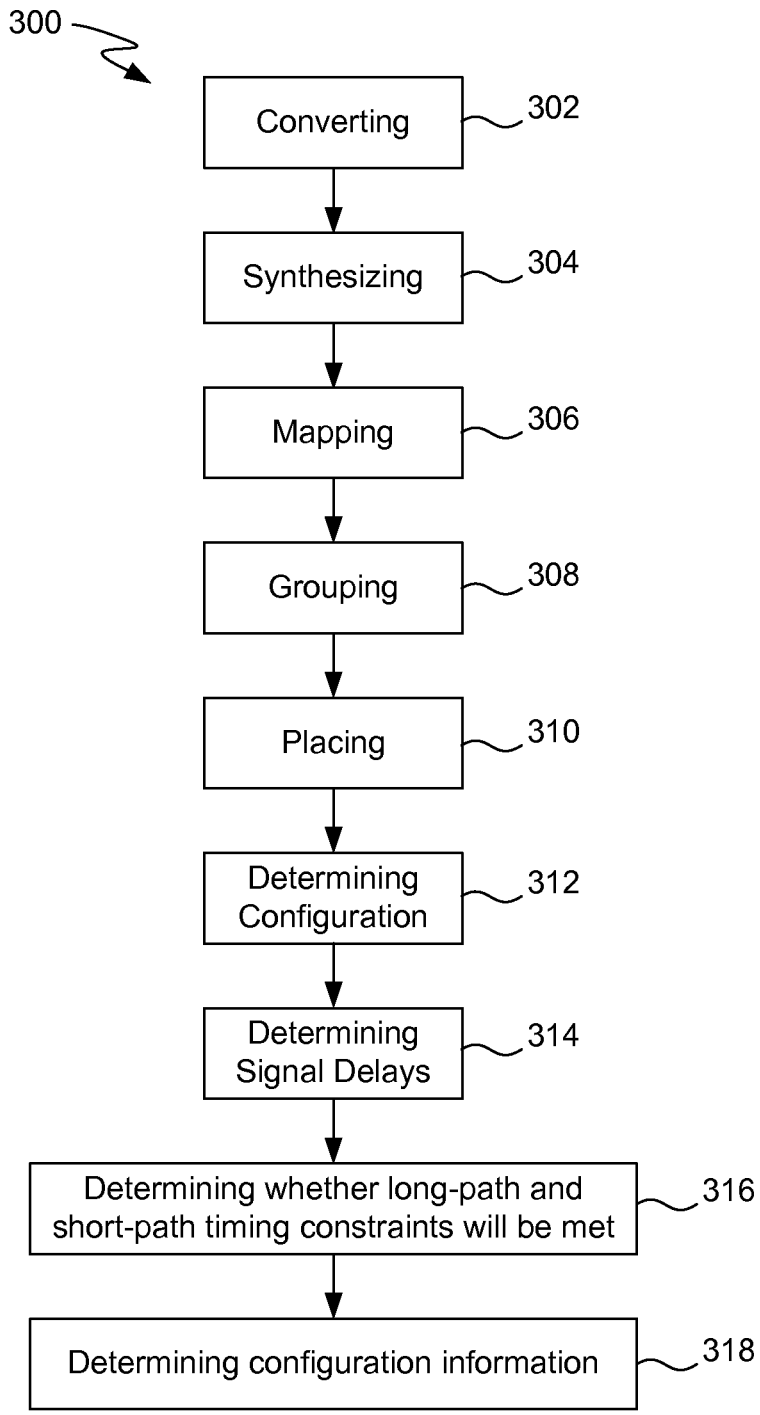
FIG. 3 is an exemplary method for creating a design of an integrated circuit, in accordance with one embodiment of the present invention.

Referring to FIG. 3, a method 300 for creating a design of an integrated circuit in accordance with one embodiment is shown. The created design may be subsequently used to generate configuration information for configuring the PLD 200. Processing unit 102 may access the program code, stored within memory device 104, for execution thereof in order to implement the method 300 in accordance with one embodiment.

Processing unit 102 may execute the program code for the method 300 to convert a user design in a given format, e.g., Hardware Description Language (HDL), into the configuration information. The PLD 200 is configured based on the configuration information in order to implement the user design.

At operation 302, a user design is converted into a register transfer layer (RTL) design of PLD 200. As an example, the RTL design may include a flow of signals between registers and logical operations that may be performed on the signals. At operation 304, the RTL design is synthesized into a set of logic gates. This set of logic gates may provide a synthesized design of PLD 200. At operation 306, the set of logic gates is mapped into a set of atoms. An atom is generally referred to irreducible constituents of a user design. The atoms may correspond to groups of logic gates and other components of the user design matching the capabilities of the LEs or other functional blocks of PLD 200. The user design may be converted into any number of different sets of atoms, depending upon the underlying hardware of PLD 200 used to implement the user design.

At operation 308, related atoms are grouped together to form clusters. At operation 310, the clusters of atoms are placed on multiple locations on PLD 200. At operation 312, configuration of the switching circuits of PLD 200 used to couple the atoms implementing the user design is determined. At operation 314, multiple signal delays, e.g., data delays, for the sets of atoms and their associated connections in the switching circuits are determined by using a timing model of the PLD 200. At operation 316, it is determined whether the implementation of the user design in PLD 200 will meet multiple long-path and short-path timing constraints. It is appreciated that in one embodiment, the timing constraints may be user specified via input device 108.

At operation 318, the configuration information is determined. The configuration information may include a configuration of each LE and the switching circuits used to couple the LEs. At operation 318, the configuration information is written in to a configuration file capable of being stored in the memory device 104 for access thereof. For example, the configuration file may be accessed by the processing unit 102 to configure the PLD 200.

Figure 4:
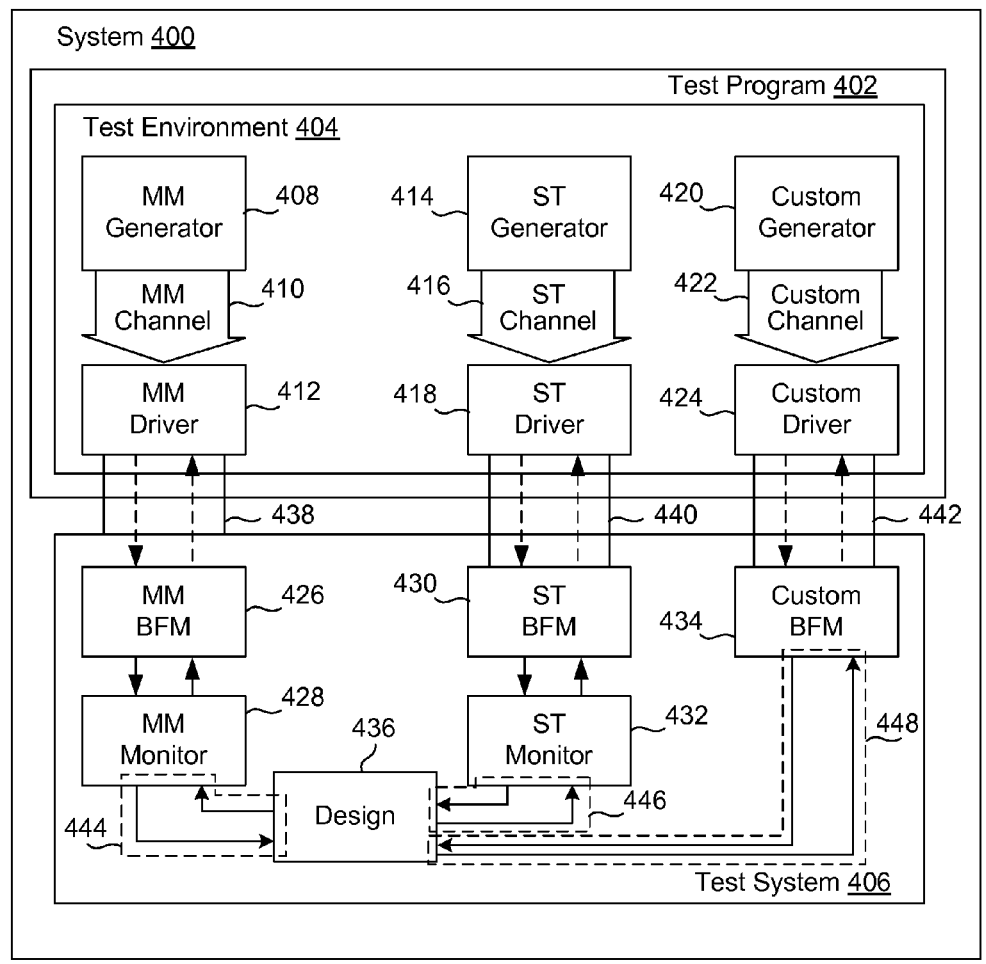
FIG. 4 is an exemplary system including the test environment and test system, in accordance with one embodiment of the present invention.

Referring to FIG. 4, a system 400 may include a test program 402 that includes a test environment 404. System 400 may further include a test system 406. Test environment 404 may include a memory-mapped (MM) generator 408, an MM channel 410, an MM driver 412, a streaming (ST) generator 414, an ST channel 416, an ST driver 418, a custom generator 420, a custom channel 422, and a custom driver 424. Test system 406 may include an MM bus functional module (MM BFM) 426, an MM monitor 428, an ST BFM 430, an ST monitor 432, a custom BFM 434, and a design under test (DUT), referred to herein as a design 436. MM generator 408, MM driver 412, ST generator 414, ST driver 418, custom generator 420, and custom driver 424, MM BFM 426, MM monitor 428, ST BFM 430, ST monitor 432, custom BFM 434, or design 436 may be sometimes referred to herein as a module of system 400. All modules of system 400 except for design 436 may be generated by execution of a verification tool, described below.

Each of MM BFM 426 and custom BFM 434 may be a master or a slave. An MM master may be a processor, a direct memory access (DMA) controller, etc. An MM slave may be a memory device, a universal asynchronous receiver transmitter (UART), a timer, a tristate bridge, a register, etc.

It is appreciated that the ST BFM 430 may be a source or a sink. An ST source may be a transmitter or a data source and an ST sink may be a receiver or a data sink. A custom master may be a processor, a controller, a transmitter, etc., and a custom slave may be a timer, a UART, a receiver, a tristate bridge, a register, a memory device, etc.

MM driver 412 is coupled with MM BFM 426 via an Application Programming Interface (API) 438. ST driver 418 may be coupled with ST BFM 430 via an API 440, and custom driver 424 is coupled with custom BFM 434 via an API 442. MM monitor 428 may be coupled with design 436 via an MM interface 444. ST monitor 432 may be coupled with design 436 via an ST interface 446, and custom BFM 434 is coupled with design 436 via a custom interface 448. It is noted that in various embodiments, MM interface 444, ST interface 446, or custom interface 448 may include one or more wired connections.

MM generator 408, MM channel 410, MM driver 412, API 438, MM BFM 426, MM monitor 428, and MM interface 444 may be in compliance with an MM protocol. ST generator 414, ST channel 416, ST driver 418, API 440, ST BFM 430, ST monitor 432, and ST interface 446 may be in compliance with an ST protocol. Moreover, custom generator 420, custom channel 422, custom driver 424, API 442, and custom interface 448 may be in compliance with a custom protocol. The custom protocol may be different from the MM protocol and the ST protocol. Examples of the MM protocol and the ST protocol are provided in a document titled "Avalon Interface Specifications", Version 1.3, August 2010, Altera Corporation™, which is incorporated by reference herein in its entirety.

MM interface 444 communicates information between MM monitor 428 and design 436 by using the MM protocol. ST interface 446 communicates information between ST monitor 432 and design 436 by using the ST protocol, and custom interface 448 communicates information between custom BFM 434 and design 436 by using the custom protocol.

Design 436 may be the RTL design output at operation 302 or the synthesized design output at operation 304. Design 436 may be a design of an integrated circuit, which may be a System on a Programmable Chip (SOPC). For example, design 436 may be an MM master, an MM slave, an ST source, an ST sink, a custom master, and/or a custom slave, to name a few. An example of the integrated circuit includes PLD 200, an ASIC, or a custom ASIC.

In various embodiments, test system 406 may not include design 436. For example, the design 436 may reside outside test system 406. In some embodiments, design 436 may comply with more than one protocol. For example, a first one of the design component may be in compliance with a first protocol, e.g., the MM protocol, and a second one of the design components may be in compliance with a second protocol, e.g., the ST protocol.

Figure 5:
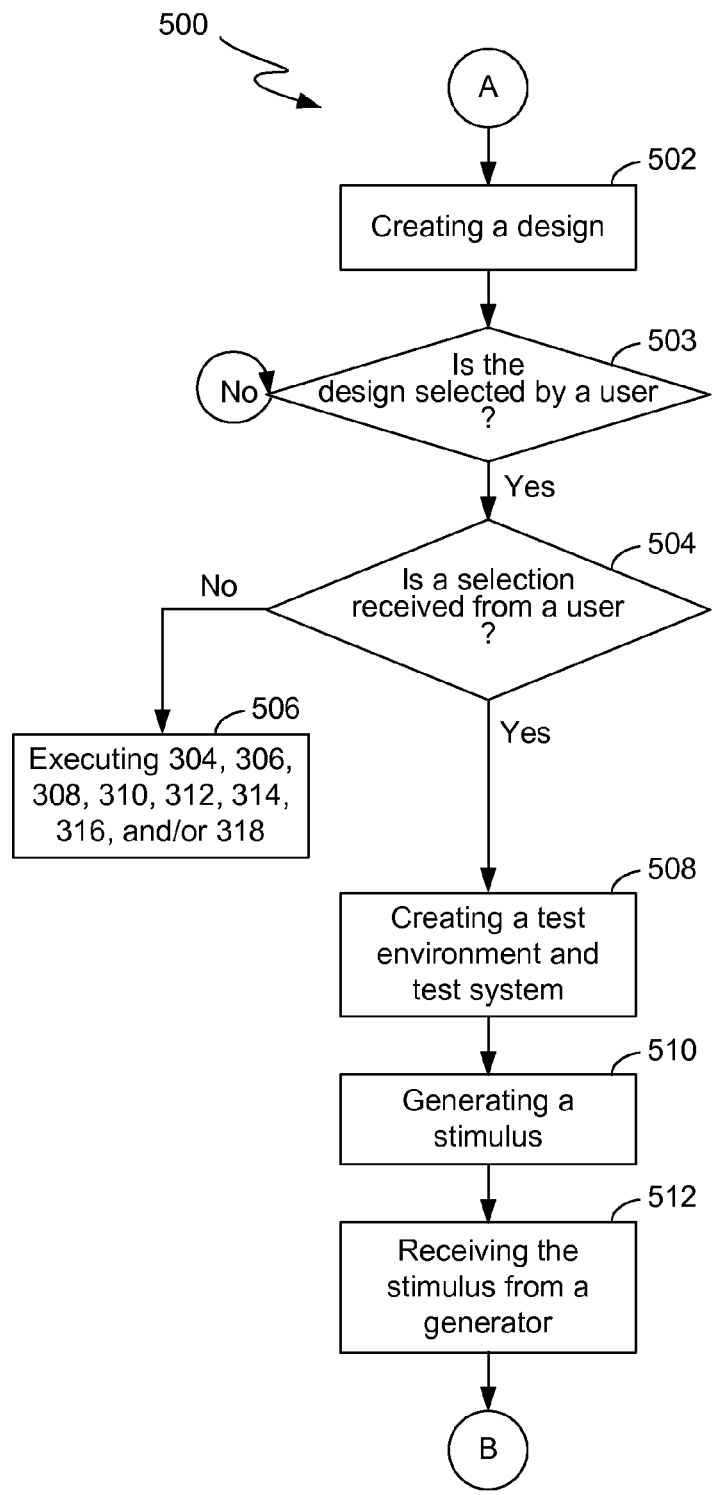
FIG. 5 is an exemplary method for generating the test environment and test system, in accordance with one embodiment of the present invention.

With reference to FIG. 5, a method 500 for generating and using the test program 402 is described. At operation 502, the processing unit 102 may create design 436. According to one embodiment, the design 436 may be created by executing an application software such as an SOPC Builder, Quartus Systems Editor (QSYS™), etc. During an extraction phase, the RTL design of the SOPC may be generated by converting a description file, as described above at operation 302. The RTL design may be generated by converting a description file that is stored by processing unit 102 to create the design at operation 502.

Subsequent to creation of design 436, at operation 503, the processing unit 102 may wait for the user to select design 436 via input device 108. In one embodiment, the design 436 is one of many selectable designs on a list of designs stored in memory device 104. It is appreciated that the user may select design 436 or any other design on the list. Accordingly, the selection of design 436 is merely exemplary and not intended to limit the scope of the present invention. In this example, processing unit 102 may receive design 436 selected by the user. Processing unit 102 continues 503 to wait until design 436 is selected by the user.

Upon creating design 436 and receiving a selection of the design 436 from the user, processing unit 102 may determine 504 whether a selection, such as a single click of input device 108 (FIG. 1) or a double click of the input device 108, is received from the user. The selection received at operation 504 may be an indication from the user to apply a verification tool. For example, the user may select an icon to perform the selection at operation 504. The verification tool may be a part of the application software. In response to the user selection of a design, e.g., design 436, and the selection at operation 504, verification tool may be applied to the selected design, e.g., design 436. In response to determining that the selection at operation 504 is not received, processing unit 102 may execute the program code for operation 506 to execute the program code for operations 304, 306, 308, 310, 312, 314, 316, and/or 318.

On the other hand, upon determining that the user selection is received at operation 504, processing unit 102 may execute the application software to retrieve the description file from memory device 104 to create 508 test environment 404 and test system 406. For example, the processing unit 102 may retrieve the description file stored in the memory device 104 in response to receiving the selection of design 436. The description file may be a QSYS™ description file, an SOPC description file, an SOPCINFO description file, etc. The description file may include one or more parameters of design components, one or more interface properties of design components, etc., associated with design 436.

To create test environment 404 and test system 406, processing unit 102 may obtain, based on the description file, the one or more parameters and the interface properties, and may generate a monitor, a BFM, a driver, a channel, and a generator based on the parameters and interface properties. As an example, the processing unit 102 generates a generator with a clock source in response to determining that a design component of design 436 uses a clock signal. A parameter in the description file may be associated with a frequency of the clock signal. The clock source may include an oscillator. Another example of a parameter is data width. In various embodiments, processing unit 102 may generate the clock source within a generator for each clock signal used by design 436. As another example, processing unit 102 may determine, whether a design component uses a reset signal. The processing unit 102 may generate a BFM that generates the reset signal for transmission to the design component if the processing unit 102 determines that a reset signal is used. Moreover, as yet another example, processing unit 102 may determine whether a design component, e.g., memory controller, controller, etc., is in compliance with the MM protocol, the ST protocol, the custom protocol, etc. Each protocol may be associated with an interface property.

Upon determining that a design component is in compliance with the MM protocol, processing unit 102 may generate MM monitor 428, MM interface 444, MM BFM 426, API 438, MM driver 412, MM channel 410, and MM generator 408, may couple MM monitor 428 to the design component via MM interface 444, may couple MM BFM 426 to MM monitor 428, may couple MM driver 412 to MM BFM 426 via API 438, and may couple MM generator 408 to MM driver 412 via MM channel 410. Moreover, upon determining that a design component is in compliance with the ST protocol, processing unit 102 may generate ST interface 446, ST monitor 432, ST BFM 430, API 440, ST driver 418, ST channel 416, and ST generator 414, may couple ST monitor 432 to the design component via ST interface 446, may couple ST BFM 430 to ST monitor 432, may couple ST driver 418 to ST BFM 430 via API 440, and may couple ST generator 414 to ST driver 418 via ST channel 416. Furthermore, upon determining that a design component is in compliance with the custom protocol, processing unit 102 may generate custom interface 448, custom BFM 434, API 442, custom driver 424, custom channel 422, and custom generator 420, may couple ST BFM 430 to the design component via custom interface 448, may couple custom driver 424 to custom BFM 434 via API 442, and may couple custom generator 420 to custom driver 424 via custom channel 422.

As still another example, processing unit 102 may determine to exclude a clock source within a generator in response to determining that a design component does not use a clock signal. As another example, in response to determining that a design component includes a memory device, processing unit 102 may determine to include an address source within a generator and the address source may be used to generate an address signal addressing a location within the memory device. The address signal is an example of the parameter. As yet another example, processing unit 102 may determine, based on the description file, that a design component uses a data signal, a clock signal, and a write signal. The data signal, the write signal, and the clock signal are examples of the parameters. As another example, processing unit 102 may determine, based on the description file, that a design component uses a valid signal, the data signal, an error signal, and a channel signal. The valid signal, the error signal, and the channel signal are examples of the parameters. As yet another example, processing unit 102 may determine, based on the description file, that a design component uses a trigger signal. The trigger signal is an example of the parameter.

Upon creation of test environment 404 and test system 406, processing unit 102 may create a top level file that includes system 400 (FIG. 4) and may store the top level file within memory device 104. Processing unit 102 may execute the top level file to generate a coverage report. The coverage report includes an indication as to whether the design 436 is functional. For example, upon creation of test environment 404 and test system 406, processing unit 102 may execute a generator to randomly or periodically generate 510 a stimulus. The user may provide, via input device 108 (FIG. 1), to processing unit 102 whether to generate the stimulus randomly or periodically. A generator generates the stimulus based on interface properties and one or more parameters of a design component. For example, the stimulus may be a clock signal sent to a design component if the design component uses the clock signal. As another example, the stimulus may be a clock signal, a write signal, and a writedata signal sent to a design component. In this example, the design component may be a register that may include a data port to receive the writedata signal, a write port to receive the write signal, and a clock port to receive the clock signal. Moreover, in this example, the write signal may be used to enable a write to the design component and the writedata signal may carry data to write to the design component. Further, in this example, the write and/or write data signal may be synchronous with the clock signal.

As another example, the stimulus may include the valid signal, the data signal, the error signal, and the channel signal. In this example, the design component may be a data sink that may include a valid port used to receive the valid signal, a data port used to receive the data signal, an error port used to receive the error signal, and a channel port used to receive the channel signal. Moreover, in this example, the valid signal may indicate that data sent to the data signal is valid. In this example, the data signal may carry information sent to the design component and the error signal may indicate an error in the data signal. Also, in the example, the channel signal may indicate a channel to send the data signal to the design component. The channel may be a port of the data sink or a timeslot during which the data signal is sent to the design component.

As yet another example, the stimulus may include a read user command or a write user command. In this example, a design component may be a memory controller and the memory controller may include a read user command port and a write user command port. The read user command port may receive the read user command and the write user command port may receive the write user command. The read user command may include a command addressed to the memory controller to read data from an address of a memory device and the write user command may include a command addressed to the design component to write data to an address of the memory device. As yet another example, a stimulus may include a trigger signal to an ALU of design 436 if the design 436 includes the ALU. The trigger signal is received at a trigger port of the ALU and the ALU may perform an arithmetic logic operation upon receiving the trigger signal. The ALU is an example of a design component. As yet another example, a generator may generate a stimulus having a byteenable signal. The byteenable signal may satisfy a constraint, such as having a value of 0 or 1, of the MM protocol. The byteenable signal may indicate to an MM slave of design 436 bytes of the writedata signal that may be ignored by the MM slave.

As still another example, a generator may generate a stimulus including an empty signal to design 436. In this example, the stimulus may include a start of packet signal indicating a start of the packet and an end of packet signal indicating an end of the packet. The empty signal may indicate that there is no information within a portion of a payload between the start of packet signal and end of packet signal. The empty signal may be received at an empty port of the design 436.

A driver may receive 512 a stimulus from a generator via a channel. For example, MM driver 412 may receive a stimulus generated by MM generator 408 via MM channel 410. As another example, ST driver 418 may receive a stimulus generated by ST generator 414 via ST channel 416. As yet another example, custom driver 424 may receive a stimulus generated by custom generator 420 via custom channel 422.

It is noted that in various embodiments, the list of designs may be in a form other than that of a waveform file or the description file. It is noted that the description file and the waveform file are examples of a formatted file. In some embodiments, processing unit 102 prevents the user from providing the formatted file describing design 436 to the processing unit 102 between a time of creation 502 and a time of creation 508. For example, the user is unable to provide, via input device 108, the formatted file to processing unit 102 between a time of creation 502 and a time of creation 508. In various embodiments, processing unit 102 prevents the user from providing the formatted file to processing unit 102 between the time of selection 503 and creation 508. In some embodiments, a module of test environment 404 is created by processing unit 102 by executing a program, such as System Verilog, System C, OMM, and/or VMM.

In various embodiments, the user may use input device 108 to modify a computer code that describes custom generator 420 to insert the custom protocol into custom generator 420. Moreover, in one embodiment, the user may use input device 108 to provide the custom protocol as a custom extension to custom generator 420 after custom generator 420 is created. In further embodiments, the user may use input device 108 to provide the custom protocol as a plug in, which plugs into custom generator 420 and is executed by custom generator 420.

In various embodiments, a generator may act as a scenario generator that generates a scenario and the scenario includes stimuli including more than one stimulus. For example, a generator may generate a scenario including a first stimulus and a second stimulus. The second stimulus is sequential to the first stimulus. The first stimulus may include the read user command and the second stimulus may include the write user command. As another example, a generator may generate a scenario including a third stimulus, a fourth stimulus, and a fifth stimulus. In this example, the fifth stimulus is sequential to the fourth stimulus and the fourth stimulus is sequential to the third stimulus. Moreover, in this example, the third stimulus may be the write user command, the fourth stimulus may be the read user command, and the fifth stimulus may be a write user command.

In various embodiments, a generator may be an atomic generator that generates only a single type of stimulus. For example, an atomic generator may generate a read user command or a write user command but not both the read and write user commands. Processing unit 102 may provide an option to the user via output device 112 (FIG. 1) to determine whether the user wishes to use the atomic generator or the scenario generator, and accordingly applies the determination received from the user.

In some embodiments, a monitor may not be available for the custom protocol. For example, processing unit 102 may not generate a custom monitor between custom BFM 434 and design 436. In one embodiment, processing unit 102 may determine, based on the description file, whether a design component is a memory controller, an UART, a memory, an Ethernet controller, a timer, a tri-state bridge, a register, a transceiver, a receiver, or a processor, to determine the one or more parameters. In various embodiments, processing unit 102 does not execute the program code for operations 304, 306, 308, 310, 312, 314, 316, and/or 318 if a selection is not received 504 from the user.

In various embodiments, processing unit 102 may execute operation 506 and 508 immediately after performing operation 503 and without performing operation 504. For example, in response to determining that the user has selected 503 the design 436, the processing unit 102 may create 508 the test environment 404 and test system 406. As another example, in response to determining that the user has not selected 503 the design 436, the processing unit 102 executes 506 the operations 304, 306, 308, 310, 312, 314, 316, and/or 318.

Figure 6:
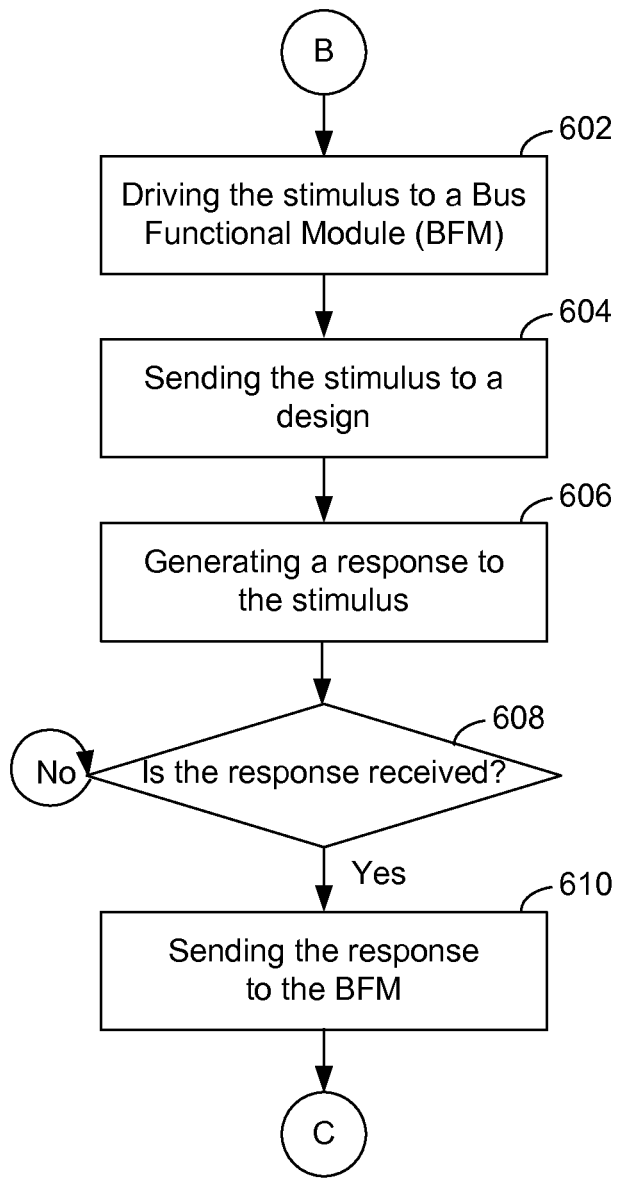
FIG. 6 is a continuation of the flowchart of FIG. 5, in accordance with one embodiment of the present invention.

Referring further to FIG. 6, a driver may drive 602 a stimulus to a BFM via a corresponding API. For example, MM driver 412 may drive a stimulus to MM BFM 426 via API 438. As another example, ST driver 418 may drive a stimulus to ST BFM 430 via API 440. As yet another example, custom driver 424 may drive a stimulus to custom BFM 434 via API 442.

BFM may receive a stimulus from a driver to generate an event. For example, MM BFM 426 may receive a stimulus from MM driver 412 and generate an event by storing information regarding the stimulus within a memory device of the MM BFM 426. As another example, ST BFM 430 may receive a stimulus from ST driver 418 and generate an event by storing information regarding the stimulus within a memory device of the ST BFM 430. Any information regarding a stimulus stored within a BFM may include a time and/or date the stimulus is received from a corresponding driver, a time and/or date the stimulus is sent from the BFM to a corresponding monitor, and/or information regarding a signal within the stimulus. The information regarding a signal within a stimulus may include information, such as, whether the signal is in compliance with the ST protocol, the MM protocol, or the custom protocol, and/or a type of the signal, such as whether the signal is a control signal or a data signal. As another example, information regarding a stimulus may include whether the stimulus is sent from a BFM to a corresponding monitor. The control signal does not include data written to or read from design 436 but may control the data signal. The valid signal, the empty signal, the clock signal, the write signal, or the read signal is an example of a control signal, and the readdata signal or the writedata signal is an example of the data signal.

The event stored within MM BFM 426 or ST BFM 430 may include one or more stimuli to be sent by the BFM to a corresponding monitor, such as MM monitor 428 or ST monitor 432. The event may further include information regarding the one or more stimuli, one or more responses to be sent to a corresponding driver, such as MM driver 412 or ST driver 418, and/or information regarding the one or more responses. A response responds to a stimulus.

A BFM may also act as a driver to drive a stimulus to a corresponding monitor. For example, MM BFM 426 may drive a stimulus received to MM monitor 428. As another example, ST BFM 430 may drive a stimulus to ST monitor 432. As yet another example, custom BFM 434 may drive a stimulus to design 436.

In sending the stimulus to a corresponding monitor or design 436, a BFM may be in compliance with a protocol, such as the MM protocol, ST protocol, or the custom protocol. For example, MM BFM 426 may hold and not send a stimulus to MM monitor 428 if MM BFM 426 has received a waitrequest signal from design 436 via MM monitor 428. As another example, ST BFM 430 may not send a stimulus to ST monitor 432 until a read signal is received from design 436 via ST monitor 432. As yet another example, custom BFM 434 may send a stimulus to design 436 regardless of whether a ready signal is received from the design 436.

A monitor may receive the stimulus from a corresponding BFM and may send 604 the stimulus to design 436 via a corresponding interface. As an example, MM monitor 428 may receive the stimulus from MM BFM 426 and may send the stimulus to design 436 via MM interface 444. As another example, ST monitor 432 may receive a stimulus from ST BFM 430 and may send the stimulus to design 436 via ST interface 446.

Design 436 may receive a stimulus from a corresponding monitor or custom BFM 434 and may generate 606 the response. For example, design 436 may receive a stimulus including the read signal, the address signal, and the clock signal from MM monitor 428 and generate the readdata signal to respond to the stimulus. In this example, the address signal may include an address of a location within a memory device of design 436. As another example, design 436 may receive the stimulus including the ready signal from ST monitor 432 and may generate the response. The response may include the valid signal, the data signal, the error signal, and the channel signal. In this example, the ready signal may indicate that ST generator 414 is ready to receive data from design 436. Moreover, the valid signal may include whether data carried in the data signal is valid and the error signal may indicate whether the data carried in the data signal has an error. The channel signal may indicated a channel for sending the data signal to ST monitor 432. As yet another example, design 436 may receive the stimulus including the write signal, the address signal, and the data signal from custom BFM 434 and generate the response. The response may include an acknowledgment signal. The write signal enables a write of data carried by the data signal to a location within a memory device of design 436 and the acknowledgment signal acknowledges to custom BFM 434 that the data is written to the memory device.

A monitor may monitor 608 whether the response is received from design 436, may store the response within a memory device of the monitor, and may determine whether the response complies with a protocol. As an example, MM monitor 428 may determine whether the response is received from design 436 and whether the response complies with the MM protocol. In this example, MM monitor 428 may store the response. As another example, ST monitor 432 may determine whether the response is received from design 436 and whether the response complies with the ST protocol. Moreover, in this example, the ST monitor 432 may store the response. A monitor may continue to monitor 608 whether the response is received until the monitor receives the response. Upon determining that the response is received, a monitor may send 610 the response to a corresponding BFM.

Figure 7:
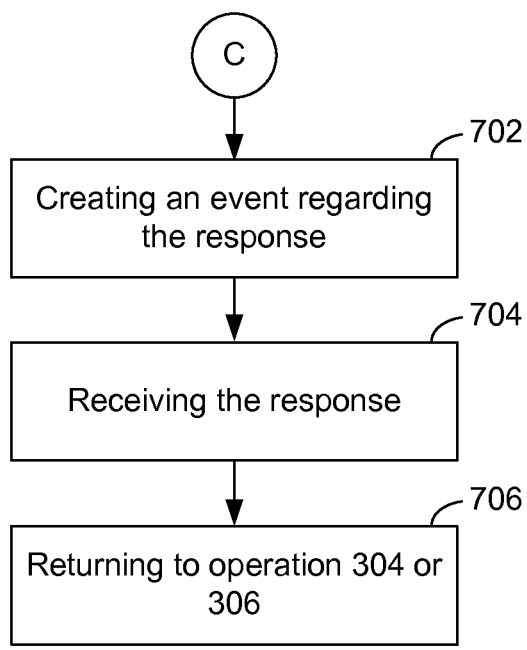
FIG. 7 is a continuation of the flowchart of FIG. 6, in accordance with one embodiment of the present invention.

With further reference to FIG. 7, a BFM may receive the response from a corresponding monitor or design 436 (FIG. 4) via a corresponding interface and may create 702 an event regarding the response. For example, MM BFM 426 (FIG. 4) may receive the response from design 436 via MM interface 444 (FIG. 4) and may generate the event by storing information regarding the response within a memory device of the MM BFM 426. As another example, ST BFM 430 (FIG. 4) may receive the response from design 436 via ST interface 446 (FIG. 4) and may generate an event by storing information regarding the response within a memory device of the ST BFM 430. As yet another example, custom BFM 434 (FIG. 4) may receive the response from design 436 via custom interface 448 (FIG. 4). Any information regarding the response is stored within a BFM and may include a time and/or date the response is received from design 436, a time and/or date the response is sent from BFM to a corresponding driver, and/or information regarding a signal within the response. The information regarding a signal within the response may include information, such as whether the signal is in compliance with the ST protocol, MM protocol, or custom protocol, and/or the type of signal. As another example, information regarding the response may include whether the response is sent from a BFM to a corresponding driver.

A BFM may also act as a sampler to sample a response. For example, MM BFM 426 may sample a response received from MM monitor. As another example, ST BFM 430 may sample a response received from ST monitor 432 (FIG. 4). As yet another example, custom BFM 434 may sample a response received from design 436.

A BFM may in compliance with a protocol, such as the MM protocol, ST protocol, or the custom protocol, to determine whether to send a response to a corresponding driver. For example, MM BFM 426 may hold and not send a response received from MM monitor 428 to MM driver 412 via interface 438 if MM BFM 426 has received a waitrequest signal from MM generator 408 via MM driver 412 (FIG. 4). As another example, ST BFM 430 may not send a response received from ST monitor 432 to ST driver until a read signal is received from ST generator 414 via ST driver 418 (FIG. 4). As yet another example, custom BFM 434 may send a response received from design 436 to custom generator 420 regardless of whether custom generator 420 sends a ready signal to custom BFM 434 (FIG. 4).

A driver may receive 704 a response from a corresponding BFM via a corresponding API. For example, MM driver 412 receives a response from MM BFM 426 via API 438 (FIG. 4). As another example, ST driver 418 may receive a response from ST BFM via API 440 (FIG. 4). As another example, custom driver 424 may receive a response from custom BFM via API 442 (FIG. 4).

Processing unit 102 thereafter may return 706 to operation 304 or 306 (FIG. 3). For example, if the RTL design is used, processing unit 102 may return 706 to operation 304 and if the synthesized design is used, processing unit 102 may return 706 to operation 306.

In some embodiments, processing unit 102 may not return to operations 304 or 306 (FIG. 3) after operation 704 is performed. It is noted that in various embodiments, MM driver 412 may drive the stimulus based on one or more events stored in the MM BFM 426 to control a flow of stimulus to the MM BFM 426 and ST driver 418 may drive a stimulus based on one or more events stored within ST BFM 430 to control a flow of stimulus to the ST BFM 430 (FIG. 4). For example, MM driver 412 may request MM BFM 426 to provide a number of events within MM BFM 426. Upon determining that the number of events exceeds a threshold, MM driver 412 may not send a stimulus to MM BFM 426 (FIG. 4). The threshold may be received from the user via input device 108. In this example, on the other hand, upon determining that the number does not exceed the threshold, MM driver 412 may send the stimulus to MM BFM 426 (FIG. 4).

In some embodiments, the custom driver 424 may drive the stimulus that may be based on a number of clock cycles of the clock signal. The clock signal may be generated by a clock source of the custom generator 420 (FIG. 4). For example, custom driver 424 may send a stimulus to custom BFM 434 at a number of clock cycles, such as one clock cycle or two clock cycles. In various embodiments, custom BFM 434 does not store an event based on the stimulus received from custom driver 424 or the response received from design 436 (FIG. 4).

In various embodiments, a driver may be modified by the user via input device 108 to apply a callback to a stimulus received from a generator. For example, MM driver 412 may be modified to apply the callback to change the read signal received from MM generator 408 into the write signal or change a write signal received from MM generator 408 (FIG. 4) into a read signal. As another example, MM driver 412 (FIG. 4) may be modified to apply the callback to change the write user command received from MM generator 408 into the read user command or change a read user command received from MM generator 408 into a write user command. As another example, ST driver 418 may be modified to apply the callback to remove the error signal received from ST generator 414. As yet another example, custom driver 424 (FIG. 4) may be modified to apply the callback to remove a signal received from custom generator 420. As another example, a driver may be modified to apply the callback to retrieve the stimulus or the response stored within a corresponding BFM. As yet another example, a driver may be modified to apply the callback to the stimulus received from a corresponding generator by appending or prepending the callback to the stimulus. In this example, the driver may prepend the callback by applying the callback to the stimulus to generate a changed stimulus and by sampling the changed stimulus. The driver may then send the changed stimulus to design 436 (FIG. 4). The driver may append the callback to the stimulus by sampling the stimulus and then applying the callback to the stimulus to generate a modified stimulus. The driver may then send the modified stimulus to design 436.

In some embodiments, a driver may be modified by the user via input device 108 to apply a transaction extension to the stimulus received from a corresponding generator and to the response received from a corresponding BFM. For example, MM driver 412 may be modified to apply the transaction extension to the stimulus received from MM generator 408 and to the response received from MM BFM 426 (FIG. 4). In this example, the transaction extension may include a byteenable signal that is added to the stimulus and an address signal that is added to the response. As another example, ST driver 418 may be modified to apply the transaction extension to the stimulus received from ST generator 414 and to the response received from ST BFM 430 (FIG. 4). In this example, the transaction extension may be the valid signal added to the stimulus and the read signal added to the response. As another example, a driver may be modified to apply a configuration extension to the stimulus received from a corresponding generator. In this example, the driver may apply the configuration extension by adding a signal to or subtracting a signal from the stimulus. The signal added may be applied by the driver to design 436 and the signal subtracted may not be applied by the driver to design 436 (FIG. 4). As another example, a driver may be modified to apply the configuration extension to the response received from a corresponding BFM. As yet another example, a driver may be modified to apply a scenario extension to the scenario received from a corresponding generator. In this example, the scenario may be a combination of the read user command and the write user command and the scenario extension may be a read user command or a write user command. In this example, after application of the scenario extension, a combination of a read user command followed sequentially by a write user command further followed sequentially by a read user command or a write user command is achieved.

In one embodiment, a driver may not be modified by the user via input device 108 to apply the transaction extension at a time of testing design 436 (FIG. 4). For example, a driver may not be modified by the user to apply the transaction extension at a time of reception of the stimulus from a corresponding generator or at a time of reception of the response from a corresponding BFM.

In various embodiments, a generator that generates the scenario is modified by the user to apply the scenario extension. It is noted that test program 402 (FIG. 4) may include one or more comments on applying the transaction extension, the configuration extension, the scenario extension, modifying a generator, modifying a driver, appending the callback, and/or prepending the callback. It is further noted that the callback, the configuration extension, and the transaction extension are used to change the MM protocol, the ST protocol, or the custom protocol.

In some embodiments, the custom BFM 434 may not create the event based on the stimulus received from custom driver 424 (FIG. 4). For example, custom BFM 434 may not store information regarding the stimulus received from custom driver 424 (FIG. 4).

In various embodiments, the custom BFM 434 may not create the event based on the response received from design 436 (FIG. 4). For example, the custom BFM 434 may not store information regarding the response received from design 436 (FIG. 4).

In certain embodiments, a monitor, such as MM monitor 428 or ST monitor 432, may send a no response signal to a corresponding generator indicating that the response is not received from design 436 (FIG. 4). On the other hand, a monitor may send the response in response to determining that the response is received from design 436 (FIG. 4).

Moreover, in various embodiments, a monitor may send a noncompliance signal to a corresponding generator upon determining that the response does not comply with a corresponding protocol, such as the MM protocol or the ST protocol. A monitor may or may not send the response with the noncompliance signal to a corresponding generator.

Figure 8:
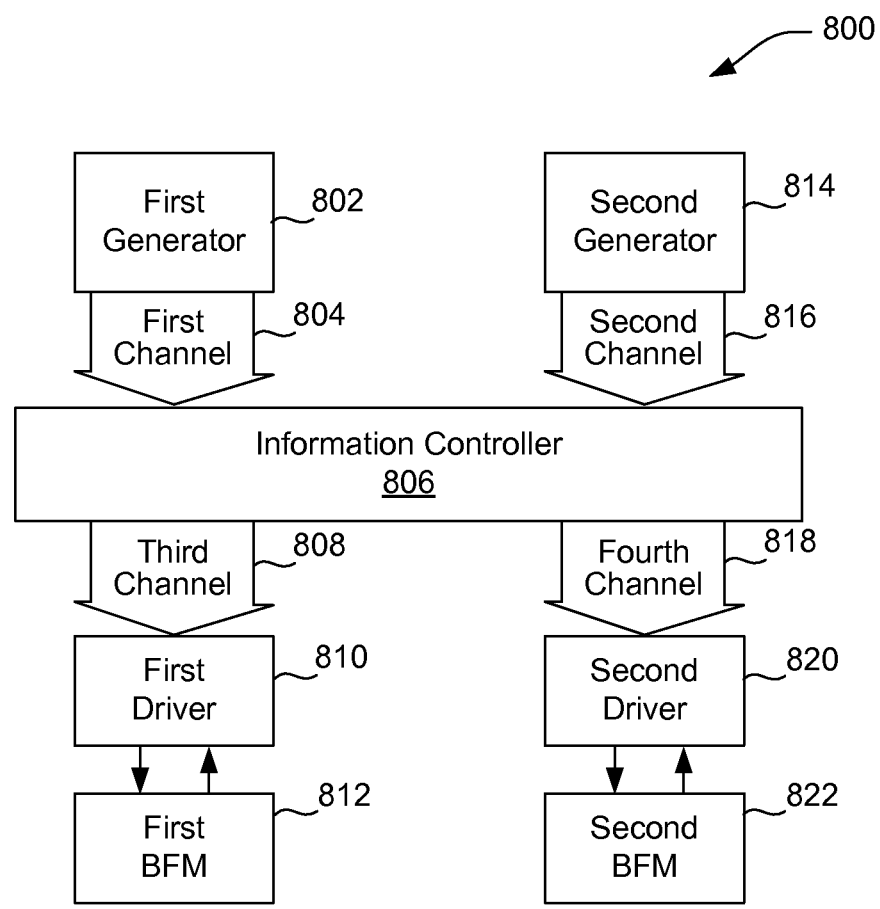
FIG. 8 is an exemplary system for controlling a flow of information, in accordance with one embodiment of the present invention.

Referring to FIG. 8, a system 800 may include a first generator 802, a first channel 804, an information controller 806, a third channel 808, a first driver 810, a first BFM 812, a second generator 814, a second channel 816, a fourth channel 818, a second driver 820, and a second BFM 822. First generator 802 may be MM generator 408, ST generator 414, or custom generator 420 (FIG. 4). Second generator 814 may be MM generator 408, ST generator 414, or custom generator 420 (FIG. 4). First channel 804 may be MM channel 410, ST channel 416, or custom channel 422 (FIG. 4). Third channel 808 may be in compliance with the same protocol as that complied by first channel 804 and fourth channel 818 may be in compliance with the same protocol as that complied by second channel 816. First driver 810 may be MM driver 412, ST driver 418, or custom driver 424 (FIG. 4). Similarly, second driver 820 may be MM driver 412, ST driver 418, or custom driver 424 (FIG. 4). Moreover, first BFM 812 may be MM BFM 426, ST BFM 430, or custom BFM 434 (FIG. 4). Second BFM 822 may be MM BFM 426, ST BFM 430, or custom BFM 434 (FIG. 4). Each of first generator 802, first channel 804, third channel 808, first driver 810, and first BFM 812 may be in compliance with the same protocol. Moreover, each of second generator 814, second channel 816, fourth channel 818, second driver 820, and second BFM 822 may be in compliance with the same protocol. As an example, information controller 806 may be a controller that may include a state machine and one or more registers. As another example, information controller 806 may be a processor or a CPU.

Figure 9:
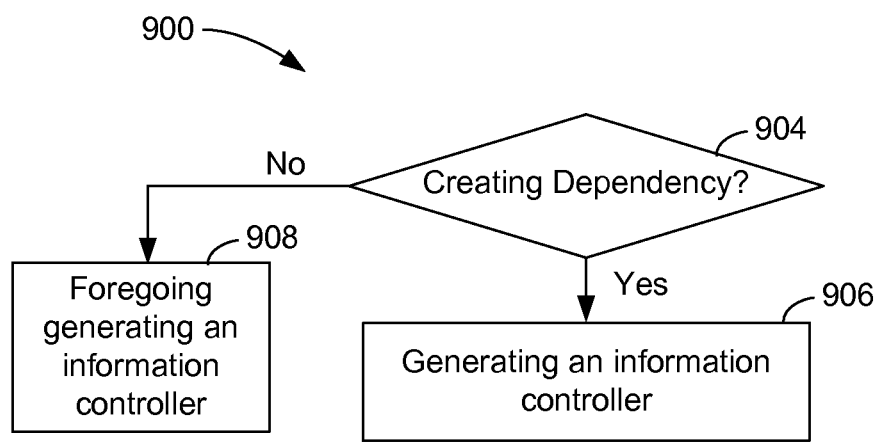
FIG. 9 is an exemplary method for controlling the flow of information, in accordance with one embodiment of the present invention.

With reference to FIG. 9, a method 900 for controlling a flow of information is described. During creation 508 (FIG. 5) of test environment 404 and test system 406 (FIG. 4), the user may determine whether to create dependency between a flow of information within first channel 804 and a flow of information within second channel 816 (FIG. 8) and may provide 904 a selection, via input device 108, to processing unit 102 (FIG. 1) regarding whether to create the dependency. Upon receiving a selection from the user to create the dependency, processing unit 102 may generate 906 information controller 806 to insert information controller 806 between first generator 802 and first driver 810 and second generator 814 and second driver 820 (FIG. 8). On the other hand, upon receiving a selection from the user not to create the dependency, processing unit 102 may not generate 908 information controller 806 and returns to continue the operation 508 (FIG. 5).

Upon generating information controller 806, processing unit 102 may create third channel 808 and fourth channel 818, and couple third channel 808 to information controller 806 (FIG. 8). The processing unit 102 may couple the third channel 808 to the first driver 810 and couple fourth channel 818 to information controller 806 (FIG. 8). The processing unit 102 may further couple the fourth channel 818 to the second driver 820 (FIG. 8). Third channel 808 may be coupled to a different port of information controller 806 than a port to which fourth channel 818 may be coupled. Moreover, upon generating information controller 806, processing unit 102 may create a dependency, such as a function, between a flow of information between first generator 802 and first driver 810 and a flow of information between second generator 814 and second driver 820. As an example, processing unit 102 may determine to synchronize, based on a clock signal, the stimulus sent by first generator 802 via first channel 804 and third channel 808 to first driver 810 with a stimulus sent by second generator 814 via second channel 816 and fourth channel 818 to second driver 820. As another example, processing unit 102 may copy the stimulus received by second driver 820 from second generator 814 to generate the stimulus received by first driver 810 from first generator 802.

In various embodiments, upon determining to create information controller 806, processing unit 102 may split MM channel 410, ST channel 416, or custom channel 422 (FIG. 4) into first channel 804 and third channel 808 (FIG. 8) and may split MM channel 410, ST channel 416, or custom channel 422 (FIG. 4) into second channel 816 or fourth channel 818 to insert the information controller 806 (FIG. 8).

In some embodiments, processing unit 102 may create an information controller between any two modules, such as between MM driver 412 and MM BFM 426 and between ST driver 418 and ST BFM 430, of test environment 404 and test system 406 (FIG. 4) in a similar manner in which information controller 806 (FIG. 8) is created. For example, upon receiving a signal from the user to create a dependency of a flow of information between MM BFM 426 and design 436 on a flow of information between custom BFM 434 and design 436 (FIG. 4), processing unit 102 may create an information controller, similar to information controller 806 (FIG. 8), between MM BFM 426 and design 436 and between custom BFM 434 and design 436.

In various embodiments, any number of information controllers may be inserted between modules of test environment 404 and test system 406 (FIG. 4) and the number may be received from the user via input device 108 (FIG. 1). In some embodiments, upon creation of information controller 806 (FIG. 8) by processing unit 102, the dependency between a first flow of information and a second flow of information is provided by the user via input device 108 to processing unit 102 (FIG. 1) for execution.

Figure 10:
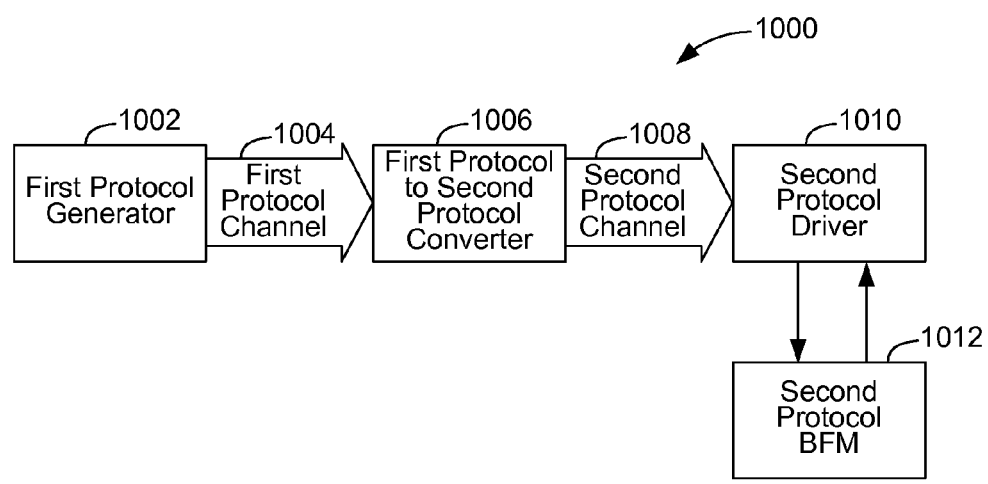
FIG. 10 is an exemplary system for converting a first protocol to a second protocol, in accordance with one embodiment of the present invention.

Referring to FIG. 10, a system 1000 for converting a first protocol into a second protocol may include a first protocol generator 1002, a first protocol channel 1004, a first protocol to second protocol (FP-SP) converter 1006, a second protocol channel 1008, a second protocol driver 1010, and a second protocol BFM 1012. The first protocol may be the MM protocol, the ST protocol, the custom protocol, or a packet protocol. The second protocol may be the MM protocol, the ST protocol, the custom protocol, or a packet protocol, and is different than the first protocol. As an example, the first protocol generator 1002 may be a packet generator, the first protocol channel 1004 may be a packet channel, the FP-SP converter 1006 may be a packet-to-ST converter, the second protocol channel 1008 may be ST channel 416, the second protocol driver 1010 may be ST driver 418, and the second protocol BFM 1012 may be ST BFM 430 (FIG. 4).

The packet protocol may communicate information in the form of a packet that includes the start of packet signal, the payload, and the end of packet signal, and may not communicate information in a form other than that of the packet. For example, the packet protocol may not communicate information including the payload without having the start of packet signal prepended to the payload and the end of packet signal appended to the payload. As another example, the packet protocol may not communicate the start of packet signal without having the payload appended to the start of packet signal and the end of packet signal appended to the payload.

Figure 11:
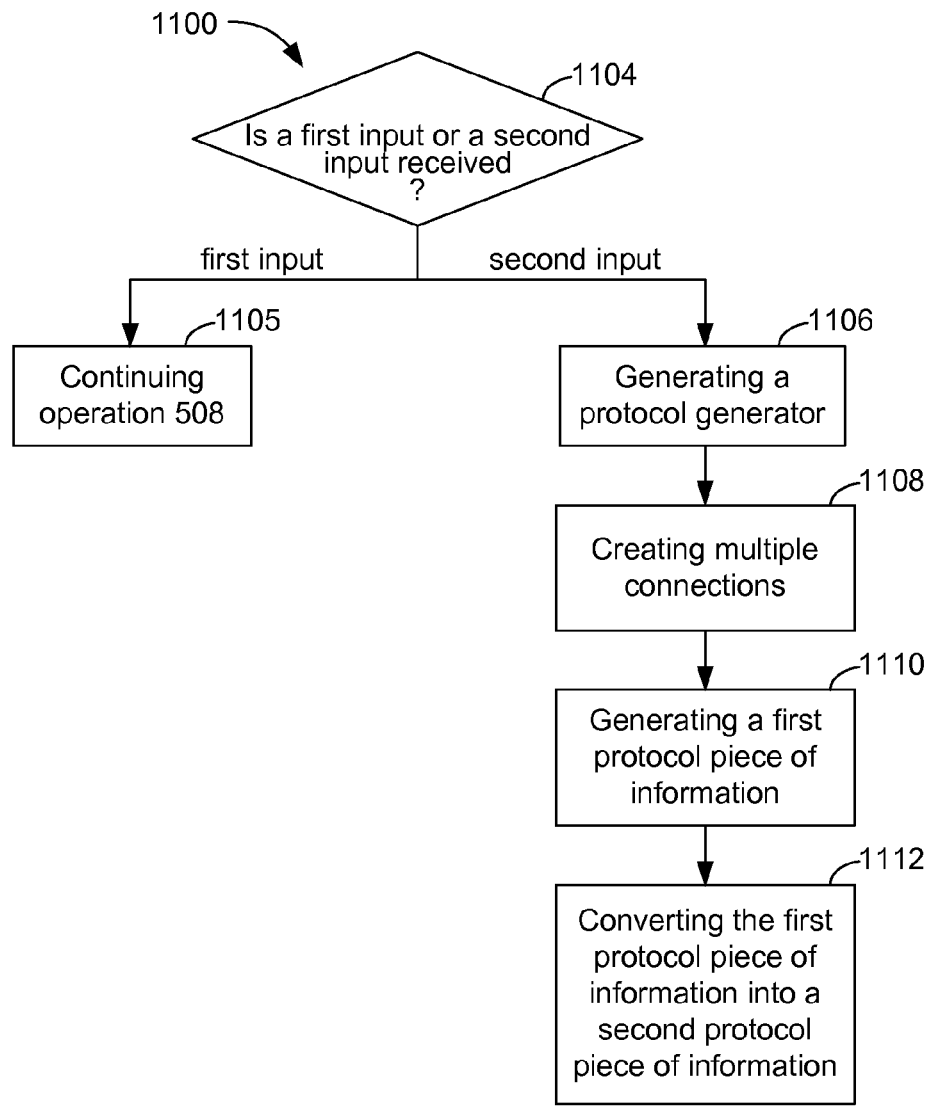
FIG. 11 is an exemplary method for converting the first protocol into the second protocol, in accordance with one embodiment of the present invention.

With reference to FIG. 11, a method 1100 for converting the first protocol into the second protocol is described. During creation 508 (FIG. 5) of test environment 404 and test system 406, processing unit 102 may determine 1104 whether a first input indicating that the user wishes to use the second protocol or a second input indicating that the user wishes to use the first protocol is received. The first or second input may be received via input device 108 (FIG. 1) from the user. In response to receiving the first input from the user indicating that the user wishes to use the second protocol, processing unit 102 may continue 1105 creation 508 (FIG. 5) by using a second protocol generator (not shown). The second protocol generator applies the second protocol. On the other hand, in response to receiving the second input from the user indicating that the user wishes to use the first protocol instead of the second protocol, processing unit 102 may generate 1106 the first protocol generator 1002, replace the second protocol generator with first protocol generator 1002, and create 1108 the first protocol channel 1004 and the FP-SP converter 1006 (FIG. 10).

First protocol generator 1002 may generate 1110 (FIG. 10) a first protocol piece of information including a stimulus. For example, the first protocol generator 1002 (FIG. 10) may generate the packet including the start of packet signal, the payload, and the end of packet signal. As an example, the start of packet signal may identify a port of first protocol generator 1002 and a port of FP-SP converter 1006 to which the packet may be sent. As another example, the end of packet signal may include a checksum that checks the payload of the packet to determine whether an error occurred in the payload during a communication of the packet between the first protocol generator 1002 and FP-SP converter 1006 (FIG. 10). First protocol generator 1002 may communicate the first protocol piece of information to FP-SP converter 1006 via first protocol channel 1006 (FIG. 10).

FP-SP converter 1006 may receive the first protocol piece of information and may convert 1112 the first protocol piece of information into a second protocol piece of information, which may be a stimulus. For example, FP-SP converter 1006 may segregate the packet into the start of packet signal, the payload, and the end of packet signal, and send the signals via different ports of FP-SP converter 1006 (FIG. 10). In this example, FP-SP converter 1006 may receive the packet via a single port and may send the start of packet signal via a first output port of FP-SP converter 1006, may send the payload via a second output port of FP-SP converter 1006, and may send the end of packet signal via a third output port of FP-SP converter 1006 (FIG. 10).

The use of first protocol generator 1002, the first protocol channel 1004, and the FP-SP converter 1006 (FIG. 10) may allow the user to deal with a transaction from a level of using the first protocol that may have a higher amount of abstraction than a level of using the second protocol. For example, the user may use input device 108 (FIG. 1) to modify the packet generated by first protocol generator 1002 without modifying a signal of the ST protocol. As another example, the user may use input device 108 (FIG. 1) to modify the packet without modifying the start of packet signal of the packet, the payload of the packet, the end of packet signal of the packet, the valid signal, and/or the ready signal. The valid signal may be sent with the packet to indicate that a portion of the payload sent during a clock cycle is valid. The ready signal may be communicated to indicate that the first protocol generator 1002 (FIG. 10) is ready to accept a data signal.

In some embodiments, the FP-SP converter 1006 may send the start of packet signal via a first port of FP-SP converter 1006 and send the payload and/or the end of packet signal via a second port of FP-SP converter 1006 (FIG. 10).

In various embodiments, the user may modify the packet to be sent by first protocol generator 1002 by using the input device 108 (FIG. 1) to insert the error signal in the packet. The error signal may include an error check value, such as a value created from the start of packet signal and the end of packet signal. The start of packet signal and the end of packet signal may be used by FP-SP converter 1006 to determine whether there is an error in the packet, such as, whether the packet includes two or more start of packet signals, whether the packet includes the start of packet signal and excludes the payload and/or the end of packet signal, whether the packet includes the end of packet signal and excludes the start of packet signal and/or the payload, and/or whether the packet includes the payload signal and excludes the start of packet signal and/or the end of packet signal.

Figure 12:
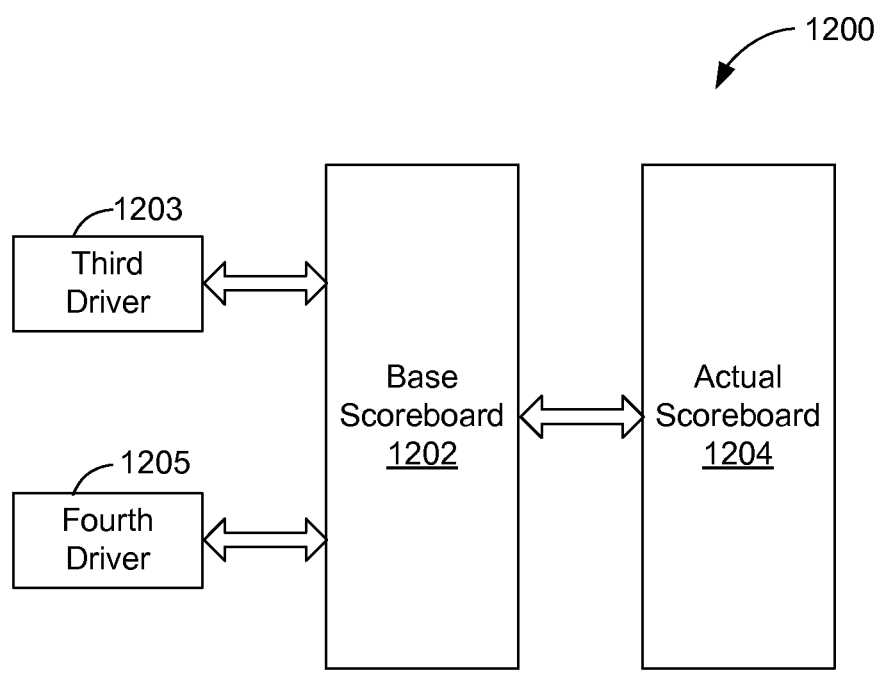
FIG. 12 is an exemplary system for verifying functionality of an interface associated with a design component, in accordance with one embodiment of the present invention.

Referring to FIG. 12, a system 1200 may include a third driver 1403, a fourth driver 1205, a base scoreboard 1202, and an actual scoreboard 1204. Third driver 1403 may be MM driver 412, ST driver 418, or custom driver 424 (FIG. 4). Fourth driver 1205 may be MM driver 412, ST driver 418, or custom driver 424 (FIG. 4).

Figure 13:
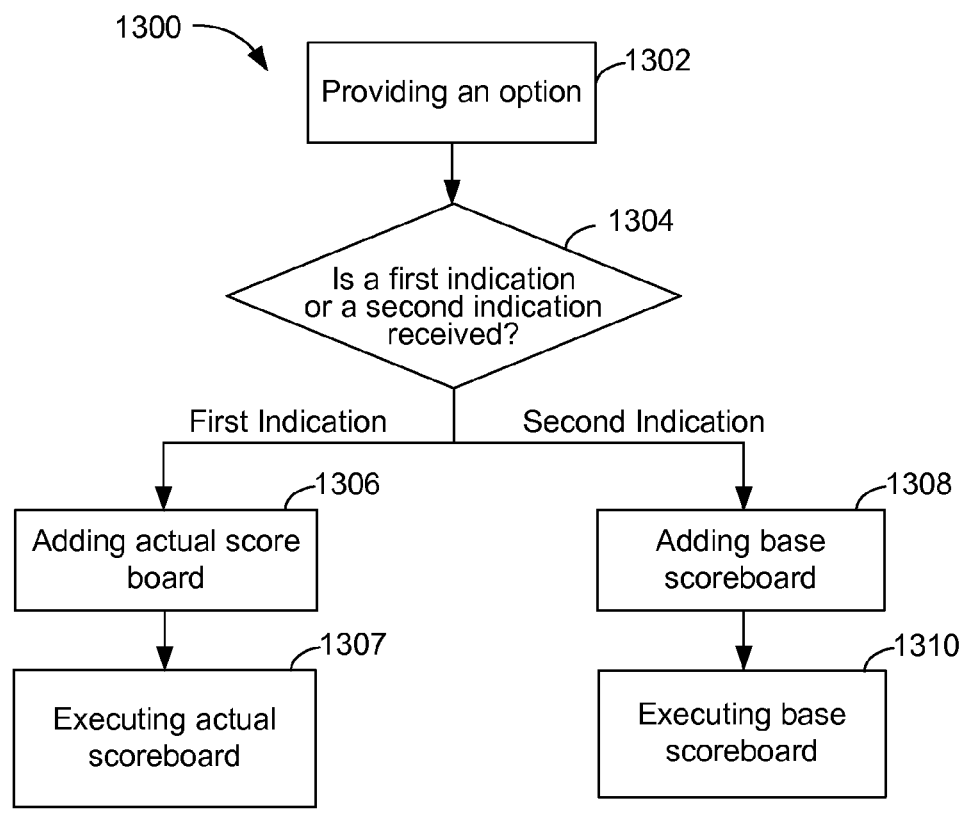
FIG. 13 is an exemplary method for verifying functionality of the interface, in accordance with one embodiment of the present invention.

With reference to FIG. 13, a method 1300 for verifying functionality of design 436 is described. In some embodiments, during creation 508, processing unit 102 may provide 1302 an option to the user to determine whether the user wishes to execute the program code for a merged callback or to obtain a determination of whether a design component satisfies criteria. The user may use input device 108 to indicate to processing unit 102 whether the user wishes to use execute the program code for the merged callback or to obtain the determination. Upon providing 1302 the option, processing unit 102 may determine 1304 whether a first indication that the user wishes to obtain the determination or a second indication that the user wishes to execute the program code for the merged callback is received. In response to receiving the first indication, processing unit 102 may add 1306 actual scoreboard 1204 (FIG. 12) to test environment 404 and/or test system 406 (FIG. 4). For example, processing unit 102 may couple actual scoreboard 1204 to third driver 1203 and fourth driver 1205 (FIG. 12). Moreover, in response to receiving the second indication, processing unit 102 may determine to add 1308 actual scoreboard 1204 and base scoreboard 1202 (FIG. 12) to test environment 404 and/or test system 406 (FIG. 4). For example, processing unit 102 may couple actual scoreboard 1204 to third driver 1403 and fourth driver 1205 and may further couple actual scoreboard 1204 to base scoreboard 1202 (FIG. 12).

Processing unit 102 may execute 1307 the program code for the actual scoreboard 1204 to determine whether a design component satisfies the criteria. For example, processing unit 102 may determine whether the response is received by a driver within a time period after the stimulus is sent by a corresponding generator. In this example, the time period is an example of a criterion provided by the user via input device 108. Moreover, in this example, if processing unit 102 determines that the response is received by the driver within the time period, processing unit 102 may determine that the criterion is satisfied. On the other hand, if processing unit 102 determines that the response is not received by the driver within the time period, processing unit 102 may determine that the criterion is not satisfied. As another example, processing unit 102 may determine whether the response is received by a driver from a design component. In this example, the processing unit 102 may determine that a criterion is not satisfied upon determining that one or more signals of the response are not received by the driver. Further, in this example, processing unit 102 may determine that the criterion is satisfied upon determining that the one or more signals are received by the driver. In various embodiments, as an example, a signal of the response not received may include the valid signal of the ST protocol, the data signal of the ST protocol, the error signal of the ST protocol, or the channel signal of the ST protocol, and the stimulus may include the ready signal of the ST protocol. In some embodiments, as another example, the stimulus may include a power signal of the custom protocol to supply power to a design component and a signal of the response not received may include the acknowledgment signal of the custom protocol or a systemfunction signal of the custom protocol. The systemfunction signal indicates that the design component is operational. The acknowledgment signal acknowledges receipt of the power signal by the design component. As yet another example, the stimulus may include the address signal of the MM protocol, the read signal of the MM protocol, and the clock signal of the MM protocol, and a signal of the response not received may include the readdata signal of the MM protocol or the readdata valid signal of the MM protocol. In this example, the readdata valid signal is sent by a design component indicating that the readdata signal is valid.

Processing unit 102 may execute the top level file to generate the coverage report that indicates whether design 436 (FIG. 4) satisfies the criteria in the form of one or more coverage points. For example, in response to determining that design 436 (FIG. 4) satisfies the criterion, processing unit 102 assigns a high coverage point to that criterion. The high coverage point may range from 6-10 in a total range of 1-10 of the one or more coverage points. As another example, in response to determining that design 436 (FIG. 4) does not satisfy the criterion, processing unit 102 assigns a low coverage point to that criterion. The low coverage point may range from 1-5. The user may determine in response to viewing the high coverage point that the design 436 is functional and may determine in response to viewing the low coverage point that the design 436 is nonfunctional.

Processing unit 102 may execute 1310 the program code for the base scoreboard 1202 to merge a first callback with a second callback (FIG. 4) to generate and execute the program code for a merged callback. The merged callback includes the first and second callbacks. The first callback may be generated by third driver 1203 and the second callback may be generated by fourth driver 1205 (FIG. 12). Upon executing the program code for the base scoreboard 1202, third driver 1203 may apply the first callback and the fourth driver 1205 (FIG. 12) may apply the second callback simultaneously, such as within a same time period. In case of the second indication, the user may not need to access the first callback and second callback separately. The user may provide the second indication to access the merged callback and upon receiving the second indication, processing unit 102 applies the first and second callbacks simultaneously. This may reduce an amount of work performed by the user in accessing the first callback and second callback separately.

In various embodiments, processing unit 102 generates and executes the program code for the actual scoreboard 1204 and base scoreboard 1202 (FIG. 12) in response to receiving the second indication.

In some embodiments, the operations 502, 503, 504, 506, 508, 510, 512, 602, 604, 606, 608, 610, 702, 704, 706, 904, 906, 908, 1104, 1105, 1106, 1108, 1110, and/or 1112 may be executed by executing the application software.

It is appreciated that operations discussed herein within reference to flowcharts of FIGS. 3, 5, 6, 7, 9, 11, and 13 may be performed in any convenient and appropriate order. For example, it is noted that the methods described in flowcharts of FIGS. 5, 6, 7, 9, 11, and 13 may be performed between operation 304 and operation 306, between operation 306 and operation 308, or between operation 308 and operation 310.

Technical effects of the herein described systems and methods for generating and using a test environment surrounding a design component include being able to easily construct test environment 404 and test system 406 (FIG. 4) without using a separate verification application software other than the application software. The application software applies at least a portion of the method 300 (FIG. 3). Moreover, systems and methods described herein allow for modification of any module of test environment 404 (FIG. 4) by the user via input device 108 (FIG. 1).

Other technical effects include providing a fast turnaround time for verification of a design component. The fast turnaround time may be facilitated by the user or processing unit 102 not exiting the application software between creation of design 436 and verification of the design 436 (FIG. 4). Processing unit 102 creates and verifies a design component of design 436 by executing the application software and without executing the separate verification application software.

Although the foregoing systems and methods have been described in detail by way of illustration and example for purposes of clarity and understanding, it will be recognized that the above described systems and methods may be embodied in numerous other specific variations and embodiments without departing from the spirit or essential characteristics of the systems and methods. Certain changes and modifications may be practiced, and it is understood that the systems and methods are not to be limited by the foregoing details, but rather is to be defined by the scope of the appended claims.

What is claimed is:

1. A method comprising:
   receiving, at a processing unit, a design selection from a user;
   converting the design selection into a register transfer layer (RTL) design under test; generating, with the processing unit, in response to receiving the design selection, a test environment and a test system, the test system coupled with the RTL design under test; and
   verifying, using the test environment, whether the RTL design under test is functional or nonfunctional by:
   determining whether the RTL design under test is in compliance with a memory-mapped protocol, a streaming protocol, or a custom protocol, wherein said generating the test environment and the test system comprises:
   generating a streaming monitor, a streaming bus functional module (BFM), a streaming driver, and a streaming generator in response to determining that the design is in compliance with the streaming protocol, wherein each of the streaming monitor, streaming BFM, streaming driver, and streaming generator is in compliance with the streaming protocol;
   coupling the RTL design under test to the streaming monitor;
   coupling the streaming monitor to the streaming BFM;
   coupling the streaming BFM to the streaming driver; and
   coupling the streaming driver to the streaming generator.

2. The method of claim 1 further comprising:
   inserting a first protocol generator within the test environment and test system in response to said receiving, wherein the first protocol generator is in compliance with a first protocol;
   receiving a determination to use a second protocol instead of the first protocol;
   converting a first protocol to second protocol in response to receiving the determination to use the second protocol; and
   replacing the first protocol generator with a second protocol generator in response to receiving the determination to use the second protocol.

3. The method of claim 1 wherein verifying whether the RTL design under test is functional or nonfunctional comprises:
   determining whether the RTL design under test is in compliance with a memory-mapped protocol;
   generating a stimulus in accordance with the memory-mapped protocol in response to determining that the RTL design under test is in compliance with the memory-mapped protocol;
   driving the stimulus to test the RTL design under test;
   storing an event related to the stimulus;
   monitoring whether a response to the stimulus is received, wherein said response is generated by the design; and
   sending the response in response to determining that the response is received.

4. The method of claim 1 wherein verifying whether the RTL design under test is functional or nonfunctional comprises:
   determining whether the design is in compliance with a memory-mapped protocol, a streaming protocol, or a custom protocol;
   generating a stimulus in accordance with the streaming protocol in response to determining that the design is in compliance with the streaming protocol;
   driving the stimulus to the design;
   storing an event related to the stimulus;

monitoring whether a response to the stimulus is received from the design; and sending the response in response to determining that the response is received.

5. The method of claim 1, wherein verifying whether the RTL design under test is functional or nonfunctional comprises:

determining whether the design is in compliance with a custom protocol;

generating a stimulus in accordance with the custom protocol in response to determining that the design is in compliance with the custom protocol;

driving the stimulus to the design; and storing an event related to the stimulus.

6. The method of claim 1 further comprising:

receiving a selection to use a scoreboard; and verifying functionality of the RTL design under test by executing the scoreboard.

7. The method of claim 1 further comprising:

generating a first stimulus in response to said receiving;

generating a second stimulus in response to said receiving;

receiving a selection to execute a scoreboard;

generating a first callback based on the first stimulus;

generating a second callback based on the second stimulus; and executing the first and second callbacks simultaneously by executing the scoreboard.

8. A method comprising:

receiving, at a processing unit, a design selection from a user;

converting the design selection into a register transfer layer (RTL) design under test; generating, with the processing unit, in response to receiving the design selection, a test environment and a test system, the test system coupled with the RTL design under test; and verifying, using the test environment, whether the RTL design under test is functional or nonfunctional by:

determining whether the RTL design under test is in compliance with a memory-mapped protocol, a streaming protocol, or a custom protocol, wherein said generating the test environment and the test system comprises:

generating a memory-mapped monitor, a memory-mapped bus functional module (BFM), a memory-mapped driver, and a memory-mapped generator in response to determining that the design is in compliance with the memory-mapped protocol, wherein each of the memory-mapped monitor, memory-mapped BFM, memory-mapped driver, and memory-mapped generator is in compliance with the memory-mapped protocol;

coupling the RTL design under test to the memory-mapped monitor;

coupling the memory-mapped monitor to the memory-mapped BFM;

coupling the memory-mapped BFM to the memory-mapped driver; and coupling the memory-mapped driver to the memory-mapped generator.

9. A method comprising:

receiving, at a processing unit, a design selection from a user;

converting the design selection into a register transfer layer (RTL) design under test; generating, with the processing unit, in response to receiving the design selection, a test environment and a test system, the test system coupled with the RTL design under test; and verifying, using the test environment, whether the RTL design under test is functional or nonfunctional by:

determining whether the RTL design under test is in compliance with a memory-mapped protocol, a streaming protocol, or a custom protocol, wherein said generating the test environment and the test system comprises:

generating a custom bus functional module (BFM), a custom driver, and a custom generator in response to determining that the design is in compliance with the custom protocol, wherein each of the custom BFM, custom driver, and custom generator is in compliance with a custom protocol, wherein the custom protocol is other than a memory-mapped protocol and a streaming protocol;

coupling the RTL design under test to the custom BFM;

coupling the custom BFM to the custom driver; and coupling the custom driver to the custom generator.

10. A method comprising:

receiving, at a processing unit, a design selection from a user;

generating, with the processing unit, in response to receiving the design selection a test environment and a test system; and verifying, using the test environment, whether the RTL design under test is functional or nonfunctional;

generating a first set of components that is in compliance with a first protocol and a second set of components that is in compliance with a second protocol in response to said receiving, wherein the components of the first set comprise a first component and a second component, wherein the components of the second set comprise a third component and a fourth component;

generating a first flow of information between the first component and the second component;

generating a second flow of information between the third component and the fourth component;

receiving a selection to create a dependency between the first flow of information and the second flow of information;

inserting a controller between the first component and the second component in response to said receiving to create the dependency;

inserting the controller between the third component and the fourth component in response to said receiving to create the dependency; and modifying dependency between the first flow of information and the second flow of information; wherein verifying whether the RTL design under test is functional or nonfunctional comprises:

determining whether the RTL design under test is in compliance with a memory-mapped protocol, a streaming protocol, or a custom protocol, wherein said generating the test environment and the test system comprises:

generating a streaming monitor, a streaming bus functional module (BFM), a streaming driver, and a streaming generator in response to determining that the design is in compliance with the streaming protocol, wherein each of the streaming monitor, streaming BFM, streaming driver, and streaming generator is in compliance with the streaming protocol;

coupling the RTL design under test to the streaming monitor;

coupling the streaming monitor to the streaming BFM;

coupling the streaming BFM to the streaming driver; and coupling the streaming driver to the streaming generator.

11. A system comprising:

a memory operable to store data; and a processor coupled with said memory, said processor operable to:
receive a design selection from a user using a software application;
convert the design selection into a register transfer layer (RTL) design under test; and
generate, in response to the reception of the design selection, a test environment and a test system, the test system coupled with the RTL design under test;
verify, using the test environment, whether the RTL design under test is functional or nonfunctional by:
determining whether the design is in compliance with a memory-mapped protocol, a streaming protocol, or a custom protocol;
generating a streaming monitor, a streaming bus functional module (BFM), a streaming driver, and a streaming generator in response to making the determination that the design is in compliance with the streaming protocol, wherein each of the streaming monitor, streaming BFM, streaming driver, and streaming generator is in compliance with the streaming protocol;
coupling the design to the streaming monitor;
coupling the streaming monitor to the streaming BFM;
coupling the streaming BFM to the streaming driver; and
coupling the streaming driver to the streaming generator.

12. A system comprising:

a memory operable to store data; and a processor coupled with said memory, said processor operable to:
receive a design selection from a user using a software application;
convert the design selection into a register transfer layer (RTL) design under test; and
generate, in response to the reception of the design selection, a test environment and a test system, the test system coupled with the RTL design under test
verify, using the test environment, whether the RTL design under test is functional or nonfunctional by:
determining whether the RTL design under test is in compliance with a memory-mapped protocol, a streaming protocol, or a custom protocol;
generating a custom bus functional module (BFM), a custom driver, and a custom generator in response to making the determination that the design is in compliance with the custom protocol, wherein each of the custom BFM, custom driver, and custom generator is in compliance with the custom protocol;
coupling the design to the custom BFM;
coupling the custom BFM to the custom driver; and
coupling the custom driver to the custom generator.

13. A non-transitory computer-readable medium having instructions stored thereon that, if executed by a computing device, cause the computing device to perform operations comprising:

receiving a design selection from a user using a software application;

converting the design selection into a register transfer layer (RTL) design under test;

generating, in response to receiving the design selection a test environment and a test system, the test system coupled with the RTL design under test; and verifying, using the test environment, whether the RTL design under test is functional or nonfunctional by:
determining whether the RTL design under test is in compliance with a memory-mapped protocol, a streaming protocol, or a custom protocol, wherein said generating the test environment and the test system comprises:
generating a streaming monitor, a streaming bus functional module (BFM), a streaming driver, and a streaming generator in response to determining that the design is in compliance with the streaming protocol, wherein each of the streaming monitor, streaming BFM, streaming driver, and streaming generator is in compliance with the streaming protocol;
coupling the RTL design under test to the streaming monitor;
coupling the streaming monitor to the streaming BFM;
coupling the streaming BFM to the streaming driver; and
coupling the streaming driver to the streaming generator.

14. The computer-readable medium of claim 13, wherein the verifying whether the RTL design under test is functional or nonfunctional comprises:

inserting a first protocol generator within the test system and test environment in response to receiving the selection to create the test system and test environment, wherein the first protocol generator is in compliance with a first protocol;

receiving a determination to use a second protocol instead of the first protocol;

inserting a first protocol to second protocol converter in response to receiving the determination to use the second protocol; and replacing the first protocol generator with a second protocol generator in response to receiving the determination to use the second protocol generator.

* * * * *